(12) United States Patent
Seok (10) Patent No.: US 10,062,686 B2
(45) Date of Patent: Aug. 28, 2018

(54) REVERSE BIPOLAR JUNCTION TRANSISTOR INTEGRATED CIRCUIT

(71) Applicant: IXYS Corporation, Milpitas, CA (US)

(72) Inventor: Kyoung Wook Seok, Milpitas, CA (US)

(73) Assignee: IXYS, LLC, Milpitas, CA (US)

( * ) Notice: Subject to any disclaimer, the term of this patent is extended or adjusted under 35 U.S.C. 154(b) by 0 days.

(21) Appl. No.: 15/412,051

(22) Filed: Jan. 22, 2017

(65) Prior Publication Data

US 2017/0162561 A1 Jun. 8, 2017

Related U.S. Application Data

(63) Continuation of application No. 14/675,704, filed on Mar. 31, 2015, now Pat. No. 9,589,953.

(51) Int. Cl.
| | |
|---|---|
| H01L 21/8222 | (2006.01) |
| H01L 29/66 | (2006.01) |
| H01L 27/06 | (2006.01) |
| H01L 29/732 | (2006.01) |
| H01L 29/861 | (2006.01) |
| H01L 29/06 | (2006.01) |
| H02M 7/219 | (2006.01) |
| H02M 1/44 | (2007.01) |

(52) U.S. Cl.
CPC ...... *H01L 27/0664* (2013.01); *H01L 29/0649* (2013.01); *H01L 29/732* (2013.01); *H01L 29/7327* (2013.01); *H01L 29/861* (2013.01); *H02M 1/44* (2013.01); *H02M 7/219* (2013.01); *H01L 2924/1305* (2013.01)

(58) Field of Classification Search
CPC ............. H01L 27/0664; H01L 27/0647; H01L 27/0652; H01L 27/067; H01L 29/732; H01L 29/73; H01L 29/7327; H01L 2924/1305
USPC ................. 257/577, 140, E21.608, E27.022; 438/328
See application file for complete search history.

(56) References Cited

U.S. PATENT DOCUMENTS

| | | | |
|---|---|---|---|
| 3,909,700 A | 9/1975 | Ferro | ............................... 321/47 |
| 4,727,408 A * | 2/1988 | Hatakeyama | ....... H01L 27/0255 257/544 |
| 5,306,937 A | 4/1994 | Nishimura | .................... 257/328 |

(Continued)

*Primary Examiner* — Aaron Gray
(74) *Attorney, Agent, or Firm* — Imperium Patent Works; T. Lester Wallace; Andrew C. Palmer (57) ABSTRACT

A Reverse Bipolar Junction Transistor (RBJT) integrated circuit comprises a bipolar transistor and a parallel-connected distributed diode, where the base region is connected neither to the collector electrode nor to the emitter electrode. The bipolar transistor has unusually high emitter-to-base and emitter-to-collector reverse breakdown voltages. In the case of a PNP-type RBJT, an N base region extends into a P− epitaxial layer, and a plurality of P++ collector regions extend into the base region. Each collector region is annular, and rings a corresponding diode cathode region. Parts of the epitaxial layer serve as the emitter, and other parts serve as the diode anode. Insulation features separate metal of the collector electrode from the base region, and from P− type silicon of the epitaxial layer, so that the diode cathode is separated from the base region. This separation prevents base current leakage and reduces power dissipation during steady state on operation.

20 Claims, 10 Drawing Sheets

CROSS-SECTIONAL TOP-DOWN AND SIDE
VIEWS OF RECTANGLE 38 OF FIG. 9

(56) References Cited

U.S. PATENT DOCUMENTS

| | | | |
|---|---|---|---|
| 8,648,399 B2 | 2/2014 | Seok .............................. | 257/277 |
| 8,649,199 B2 | 2/2014 | Seok .............................. | 363/147 |
| 8,737,094 B2 | 5/2014 | Seok et al. .................. | 363/21.14 |
| 2011/0012232 A1 | 1/2011 | Lin et al. ....................... | 257/586 |
| 2011/0169015 A1* | 7/2011 | Negoro ............... | H01L 23/3171 257/77 |
| 2013/0128626 A1* | 5/2013 | Seok ................. | H02M 3/33592 363/21.14 |
| 2013/0285210 A1 | 10/2013 | Seok .............................. | 257/566 |
| 2014/0353799 A1* | 12/2014 | Hwang ................ | H01L 29/732 257/577 |

\* cited by examiner

FRONT VIEW
OF THE AC LINE FILTER AND
RECTIFIER MODULE (ACLF/RM)
FIG. 1

SIDE VIEW OF
THE ACLF/RM
FIG. 2

BOTTOM VIEW
OF THE ACLF/RM
FIG. 3

PERSPECTIVE VIEW OF THE TOP
OF THE ACLF/RM
FIG. 4

PERSPECTIVE VIEW OF THE
BOTTOM OF THE ACLF/RM

FIG. 5

PERSPECTIVE VIEW OF TOP WITH
METAL HOUSING REMOVED

FIG. 6

CURRENT FLOW THROUGH AC LINE FILTER
AND AC-TO-DC RECTIFIER MODULE

FIG. 7

PNP RBJT INTEGRATED CIRCUIT

FIG. 8

TOP-DOWN VIEW OF THE
RBJT INTEGRATED CIRCUIT

FIG. 9

CROSS-SECTIONAL TOP-DOWN AND SIDE
VIEWS OF RECTANGLE 38 OF FIG. 9

FIG. 10

| REGION | TYPE | DOPANT | FORMATION | DOPING CONC. (ATOMS/CCM) | DEPTH (MICRONS) |
|---|---|---|---|---|---|
| COLLECTOR REGIONS | P++ | BORON | DIFFUSION FROM SURFACE | 2.0E20 NEAR SURFACE | FROM SURFACE TO BOTTOM OF COLLECTOR REGION 0.5 MICRONS |
| BASE REGIONS | N | PHOS | DIFFUSION FROM SURFACE | 1.0E17 | FROM SURFACE TO BOTTOM OF BASE REGION (IN AREAS UNDER COLLECTOR REGIONS) 2.8 MICRONS |
| | | | | 1.0E19 | FROM SURFACE TO BOTTOM OF BASE REGION (IN AREAS UNDER BASE CONTACTS) 4.0 MICRONS |
| DIODE CATHODE DIFFUSION | N | PHOS | DIFFUSION FROM SURFACE | 1.0E19 | FROM SURFACE TO THE BOTTOM OF DIODE CATHODE REGION 4.0 MICRONS |
| | | | | | DIAMETER ACROSS THE DIODE CATHODE REGION 10 MICRONS |
| GUARD RINGS | N | PHOS | DIFFUSION FROM SURFACE | 1.0E17 | FROM SURFACE TO THE BOTTOM OF THE GUARD RINGS 2.8 MICRONS |
| DISTANCE BETWEEN DIODE CATHODE AND EDGE OF BASE REGION | | | | | 1.2 MICRONS |
| FIRST INSULATION LAYER | | | CVD DEPOSITED SILICON OXIDE | | FROM SURFACE UP TO THE TOP OF THE INSULATION LAYER 1.0 MICRON |
| LIGHTLY DOPED LAYER | P- | BORON | EPI GROWN FROM SUBSTRATE | (1.0E16 AT SURFACE) (3E14 TO JUNCTION W/ SUBSTRATE) | TOP: DIFFUSION FROM SURFACE FROM SURFACE TO BOTTOM OF EPI 30 MICRONS |
| SUBSTRATE | P++ | BORON | SUBSTRATE | 2.0E19 | SINGLE CRYSTAL SILICON SUPPORT WAFER |

FIG. 11

PNP RBJT STRUCTURE
OF USP 8,648,399

FIG. 12

NOVEL PNP RBJT STRUCTURE

FIG. 13

EMITTER TO COLLECTOR   1.2 W
EMITTER TO BASE      + 3.2 W
                      ─────
APPROXIMATE           ↗ 4.4 W
STEADY STATE DC
POWER DISSIPATION

PNP RBJT
STRUCTURE OF USP 8,648,399
AT 60HZ

FIG. 14

EMITTER TO COLLECTOR   1.6 W
EMITTER TO BASE      + 1.6 W
                      ─────
APPROXIMATE           ↗ 3.2 W
STEADY STATE DC
POWER DISSIPATION

NOVEL PNP RBJT STRUCTURE
AT 60HZ

FIG. 15

PNP RBJT STRUCTURE IV CURVE

FIG. 16

PNP RBJT STRUCTURE OPERATION

FIG. 17

NPN RBJT INTEGRATED CIRCUIT

FIG. 18

CROSS-SECTIONAL VIEW OF AN
NPN RBJT INTEGRATED CIRCUIT

FIG. 19

REVERSE BIPOLAR JUNCTION TRANSISTOR INTEGRATED CIRCUIT

CROSS REFERENCE TO RELATED APPLICATIONS

This application is a continuation of, and claims priority under 35 U.S.C. § 120 from, nonprovisional U.S. patent application Ser. No. 14/675,704 entitled "Reverse Bipolar Junction Transistor Integrated Circuit," filed on Mar. 31, 2015, now U.S. Pat. No. 9,589,953, the subject matter of which is incorporated herein by reference.

TECHNICAL FIELD

The described embodiments relate to integrated circuits that include both a bipolar transistor as well as a parallel-connected distributed diode, to AC line filters and to rectifiers employing such integrated circuits, and to related structures and methods.

BACKGROUND INFORMATION

There are four diodes in a conventional full-wave bridge rectifier. U.S. patent application Ser. No. 13/931,599 discloses a circuit referred to here as a "low forward voltage rectifier" that can be used in place of a diode in such a full-wave bridge rectifier. The "low forward voltage rectifier" includes a "Reverse Bipolar Junction Transistor" (RBJT) integrated circuit. The RBJT integrated circuit includes a bipolar transistor and a parallel-connected distributed diode. The diode is "parallel" in the sense that forward current through the diode flows in the same direction as the main current flow through the bipolar transistor when the transistor is on, as opposed to what is sometimes called an "anti-parallel" diode. The term "low forward voltage rectifier" as it is used here in this patent document refers to one such RBJT integrated circuit, and also may or may not include associated inductive current splitting circuitry that controls the base current of the RBJT such that the bipolar transistor and its parallel-connected diode operate together as a low forward voltage rectifier. Where there ordinarily would be a larger forward voltage drop across a standard diode (for example, about 1.0 volts) when current is flowing through the diode in a conventional full-wave bridge rectifier, a lower forward voltage drop (for example, 0.1 volts) is seen across each rectifier of a full-wave bridge rectifier that employs low forward voltage rectifiers rather than conventional diodes. This lower forward voltage drop translates into higher energy efficiency, less heat generation in the full-wave bridge rectifier, and less cost involved in providing any necessary heat sinking. How an integrated circuit involving both a bipolar transistor and a parallel-connected distributed diode can be fabricated, and how an RBJT integrated circuit can be made to operate as a rectifier having a low forward voltage drop, are described in: 1) U.S. Pat. No. 8,648,399, filed on Nov. 17, 2011, by Kyoung Wook Seok, and 2) U.S. Patent Publication US20130285210, published Oct. 31, 2013, filed as U.S. patent application Ser. No. 13/931,599 on Jun. 28, 2013, by Kyoung Wook Seok (the entire subject matter of these two patent documents is incorporated herein by reference).

SUMMARY

A Reverse Bipolar Junction Transistor (RBJT) integrated circuit comprises a bipolar transistor and a parallel-connected distributed diode. The bipolar transistor has an unusually high emitter-to-base reverse breakdown voltage of at least 156 volts, and an unusually high emitter-to-collector reverse breakdown voltage of at least 156 volts. This 156 volts is the peak voltage magnitude of a 110 VAC 60 Hz RMS sinusoidal supply voltage that the RBJT integrated circuit may be employed to rectify. In the case of a PNP-type RBJT integrated circuit, the integrated circuit comprises a P− type epitaxial silicon layer grown on and disposed on a P++ type silicon substrate layer. An N type base region extends down into the P− type epitaxial layer from an upper semiconductor surface of the epitaxial layer, and a plurality of P++ type annular collector regions extend down into the N type base region from the upper semiconductor surface. The structure also includes a plurality of N type cathode diffusion regions, each of which extends down into the epitaxial layer from the upper semiconductor surface. Each of the annular P++ type collector regions has a central hole, and surrounds a corresponding one of the cathode diffusion regions. Certain portions of the P− type epitaxial layer are the emitter of the PNP bipolar transistor of the RBJT device, whereas other portions of the P− type epitaxial layer are the anode of the parallel-connected distributed diode of the RBJT device. The diode is "distributed" in that its PN junction is distributed across a large portion of the integrated circuit area, and is not just locally disposed in one small part of the integrated circuit. The P type anode of the distributed diode is coupled to the emitter of the PNP bipolar transistor. The N type cathode of the distributed diode is coupled to the collector of the PNP bipolar transistor. A collector metal electrode is coupled to the collector regions of the PNP bipolar transistor and to the cathode regions of the distributed diode, but is not coupled either to any P− type silicon of the epitaxial layer or to the base region. A base metal electrode is coupled to the base of the PNP bipolar transistor, but is not coupled to the collector of the bipolar transistor, or to the emitter of the PNP bipolar transistor, or to any of the cathode diffusion regions of the parallel-connected distributed diode. The entire bottom surface of the P++ type substrate silicon layer is covered with metal. This metal is an emitter metal electrode of the RBJT integrated circuit.

In one novel aspect, the base region of the RBJT integrated circuit is physically and electrically separated from the collector metal electrode by washer-shaped insulation layer features. These washer-shaped insulation layer features also separate the collector metal electrode from P− type silicon of the epitaxial layer where the P− type silicon of the epitaxial layer surrounds the cathode diffusion regions. The resulting isolation and separation of the N type base regions from the collector metal electrode and from the N type cathode diffusion regions prevents base current leakage during steady state on operation when the RBJT is to be fully on and conducting current in a rectifying application.

In another novel aspect, a complementary NPN-type RBJT integrated circuit is disclosed. In similar fashion to the PNP-type RBJT integrated circuit described above, the complementary NPN-type RBJT integrated circuit also has washer-shaped insulation layer features that prevent base current leakage through the RBJT during steady state on operation. The layer of epitaxial silicon into which the base region extends is an emitter/distributed diode electrode layer in that it serves both as the emitter of the bipolar transistor as well as one of the diode electrodes (in this case, the P type anode electrode) of the distributed parallel diode.

In yet another novel aspect, an AC Line Filter/Rectifier Module (ACLF/RM) is disclosed. The novel ACLF/RM performs both AC line filter functions as well as a full-wave bridge rectifying function. In one example, the ACLF/RM receives a 110 VAC RMS supply voltage onto input terminals of the ACLF/RM, performs full-wave rectification and line filtering, and outputs a full-wave rectified version of the input supply voltage signal onto output terminals of the ACLF/RM. A full-wave bridge rectifier within the ACLF/RM comprises two of the novel NPN RBJT integrated circuits and two of the novel PNP RBJT integrated circuits. A two-winding inductor of the ACLF/RM provides the proper drive base currents to the four RBJT integrated circuits such that the four RBJT integrated circuits turn on and off as appropriate at the proper times and operate as a full-wave bridge rectifier.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings.

Figure 1:
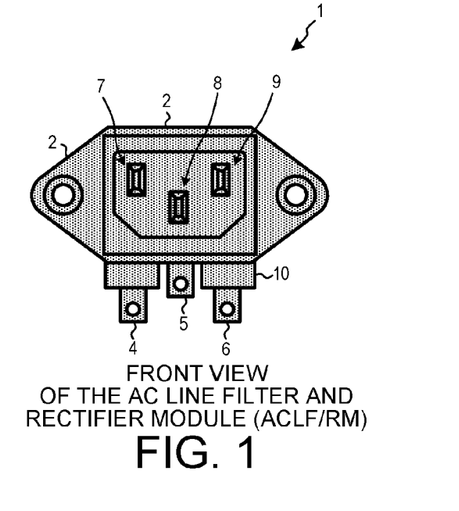
FIG. 1 is a front view of an AC Line Filter/Rectifier Module (ACLF/RM) in accordance with one novel aspect.
Figure 2:
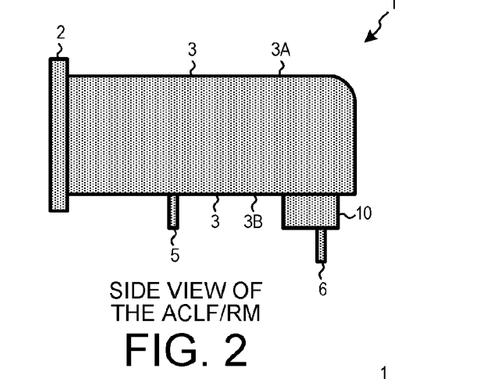
FIG. 2 is a side view of the ACLF/RM of FIG. 1.
Figure 3:
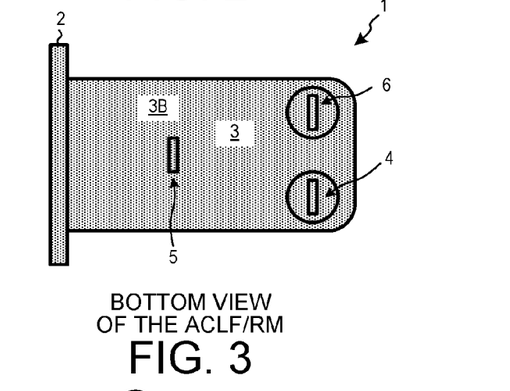
FIG. 3 is a bottom view of the ACLF/RM of FIG. 1.

FIG. 1 is a front view of one embodiment of an AC Line Filter/Rectifier Module (ACLF/RM) 1 that includes a full-wave bridge rectifier, where the full-wave bridge rectifier involves four efficient RBJT "low forward voltage rectifiers" in accordance with one novel aspect. FIG. 2 is a side view of the ACLF/RM 1. FIG. 3 is a bottom view of the ACLF/RM 1. The ACLF/RM 1 performs an AC line filtering function as an ordinary AC line filter does, but the ACLF/RM also performs a full-wave rectification function. More particularly, the full-wave bridge rectifier in the ACLF/RM includes two NPN RBJT integrated circuit devices (that operate as two low forward voltage rectifiers) and two NPN RBJT integrated circuit devices (that operate as two more low forward voltage rectifiers). Two two-winding inductors of the ACLF/RM both perform AC line filtering functions, and also perform a current splitting function for driving the RBJT integrated circuits so that the RBJT integrated circuits will operate properly as low forward voltage rectifiers in the full-wave bridge rectifier.

Advantageously, the ACLF/RM 1 of FIG. 1 has the appearance of a common commercially available AC line filter module. The ACLF/RM 1 includes an IEC 60320 C14 AC inlet power socket portion 2, a metal housing 3, and three DC output module terminals 4, 5 and 6. The AC inlet power socket portion 2 includes three AC input module terminals 7, 8 and 9. AC input module terminal 8 is coupled to DC output module terminal 5. These terminals 8 and 5 are ground terminals. There are multiple ways of realizing the metal housing 3. In one example, two metal pieces are welded or otherwise joined together to make the metal housing. These two pieces are a stamped scoop-shaped case portion 3A a flat planar cover portion 3B.

Figure 4:
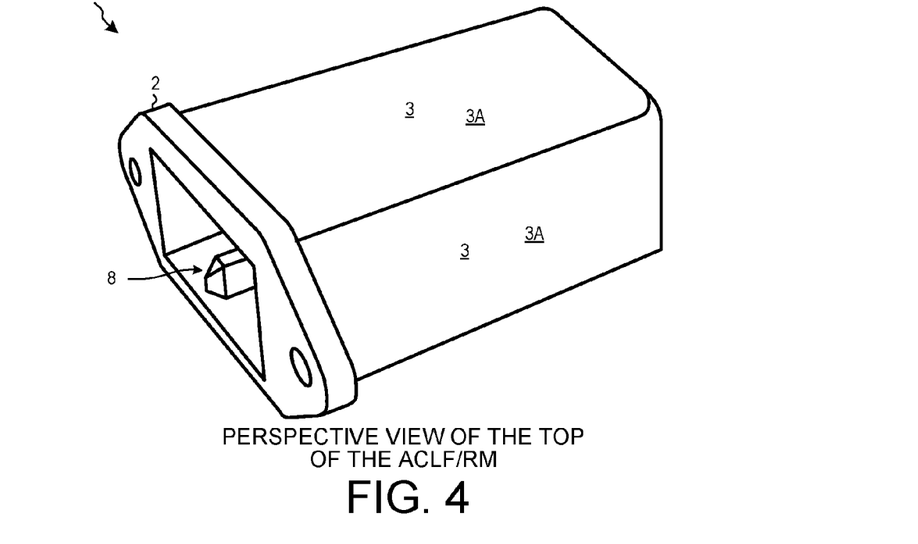
FIG. 4 is a perspective view of the ACLF/RM of FIG. 1.
Figure 5:
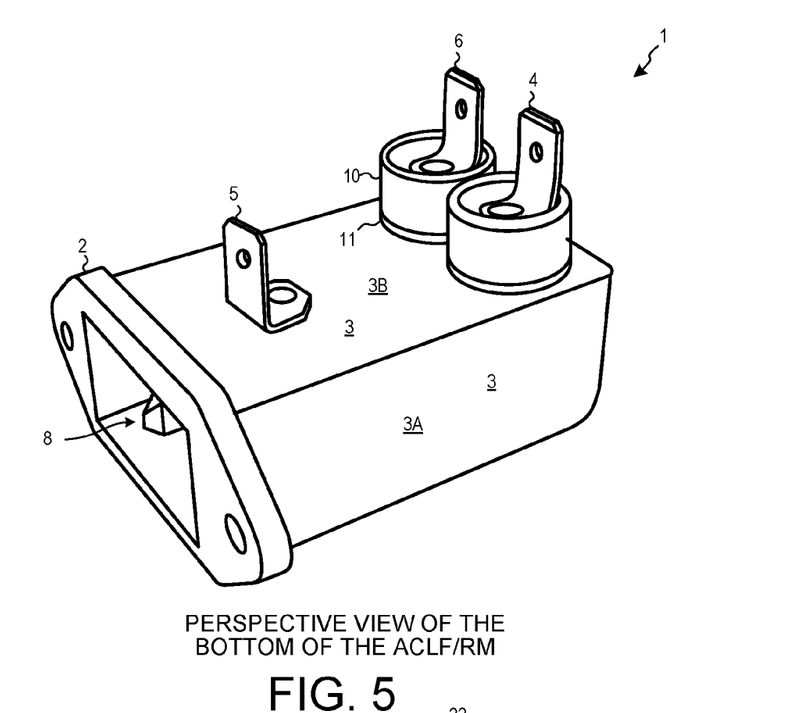
FIG. 5 is a perspective view from the vantage of a front/bottom corner of the ACLF/RM of FIG. 1.

FIG. 4 is a perspective view from the vantage of a front/top corner of the ACLF/RM 1. FIG. 5 is a perspective view from the vantage of a front/bottom corner of the ACLF/RM 1. Terminal 5 is a tab terminal that is connected by a rivet to the metal housing 3. Terminal 5 is also electrically connected to terminal 8 via a metal wire or strip. Terminal 6 is a tab terminal that is insulated from the metal housing 3 by an insulative plastic standoff 10 and insulative washer 11 and a second insulative washer (not shown) located on the inside of the metal housing. Electrical connection is made from the metal tab terminal 6 on the outside of the metal housing, via a rivet through the center of the insulative standoff 10 and the centers of the washer 11 to a rivet head (not shown) located on the inside of the metal housing. The rivet both holds the parts 6, 10 and 11 together and also provides electrical continuity from the terminal tab 6 on the outside of the metal housing to the rivet head on the inside of the metal housing. Terminal 4 is fixed to the metal housing 3 in similar fashion.

Figure 6:
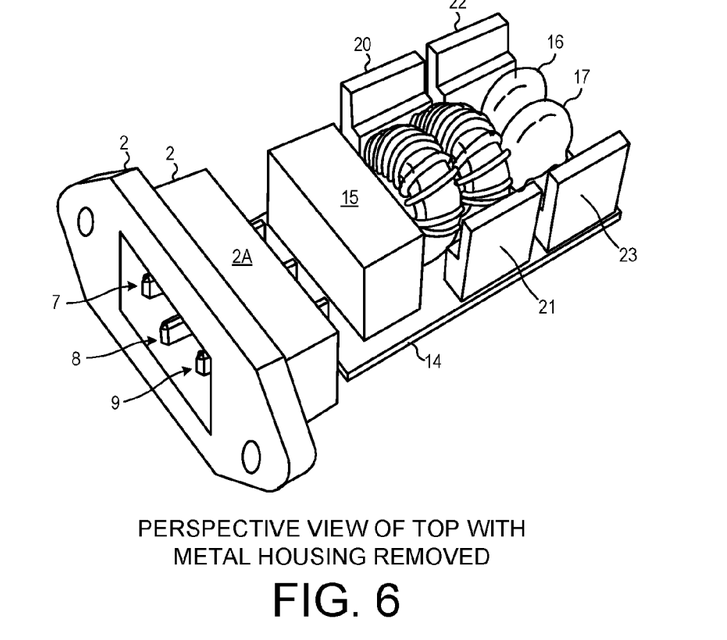
FIG. 6 is a perspective view from the same vantage as FIG. 4 except that the metal housing of the ACLF/RM is not shown.

FIG. 6 is a perspective view from the same vantage as FIG. 4 except that the metal housing 3 is not shown. The inlet power socket portion 2 has a hardened plastic block portion 2A that fits into and engages the open end of the metal housing 3. The three terminals 7, 8 and 9 are stamped metal members that extend through the plastic block portion 2A and then turn downward and engage a printed circuit board 14. Disposed on and soldered to the printed circuit board 14 are a first capacitor 15, a second capacitor 16, a third capacitor 17, a first two-winding inductor (transformer) 18, a second two-winding inductor (transformer) 19, a first packaged novel RBJT integrated circuit device 20, a second packaged novel RBJT integrated circuit device 21, a third packaged novel RBJT integrated circuit device 22, a fourth packaged novel RBJT integrated circuit device 23, and a bleed resistor 24 (not shown). Each packaged novel RBJT integrated circuit device includes an integrated circuit die disposed in a standard three-terminal TO-262 package, where the die includes a bipolar transistor and a parallel-connected distributed diode. Each packaged RBJT integrated circuit has a reverse breakdown withstand voltage between its emitter and base package terminals of at least 156 volts, and also has a reverse breakdown withstand voltage between its collector and base package terminals of at least 156 volts.

Figure 7:
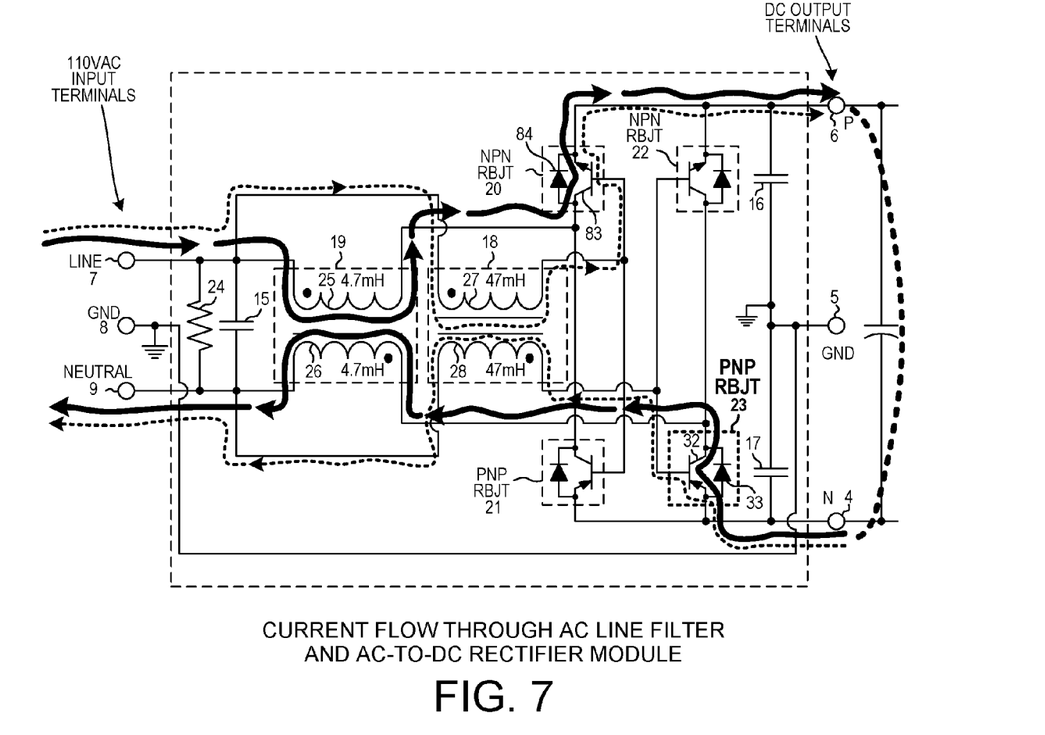
FIG. 7 is a circuit diagram that illustrates current flow through the ACLF/RM of FIG. 1.

FIG. 7 is a circuit diagram of the circuit of the ACLF/RM 1. A 110 VAC RMS 60 Hz supply voltage is present between the "line" input module terminal 7 and the "neutral" input module terminal 9. The ACLF/RM receives this 110 VAC supply voltage on its input terminals, and performs its full wave rectification function, and outputs the resulting full wave rectified voltage across its output terminals 6 and 4. As the polarity of the AC supply voltage between terminals 7 and 9 alternates, current flows through the ACLF/RM circuit in different ways. FIG. 7 shows current flow in one direction when there is a positive voltage on the line terminal 7 with respect to the neutral terminal 9. The arrows shown in heavy solid lines represent the path of main current flow whereas the arrows shown in lighter dashed lines represent the base drive current. The main current path extends from the line terminal 7, through a first winding 25 of the two-winding inductor 19, through the RBJT integrated circuit device 20, and out of the ACLF/RM via output terminal P 6, and then back into the ACLF/RM via output terminal N 4, through PNP RBJT integrated circuit device 23, through the second winding 26 of the two-winding inductor 19, and out of the ACLF/RM via the neutral input terminal 9. The four RBJT integrated circuits 20-23 are coupled together as a full-wave bridge rectifier as shown, with the base drive currents for the RBJT integrated circuits being supplied by the current-splitting two-winding inductors 18 and 19. The base current for driving the RBJT integrated circuits 20 and 23 flows as shown by the dashed arrows through a first winding 27 of the two-winding inductor 18, and into the base of the NPN RBJT integrated circuit device 20, and out of the out of the ACLF/RM via output terminal P 6, and then back into the ACLF/RM via output terminal N 4, and out of the base of the PNP RBJT integrated circuit device 23, through the second winding 28 of the two-winding inductor 18, and out of the ACLF/RM via the neutral input terminal 9.

Figure 8:
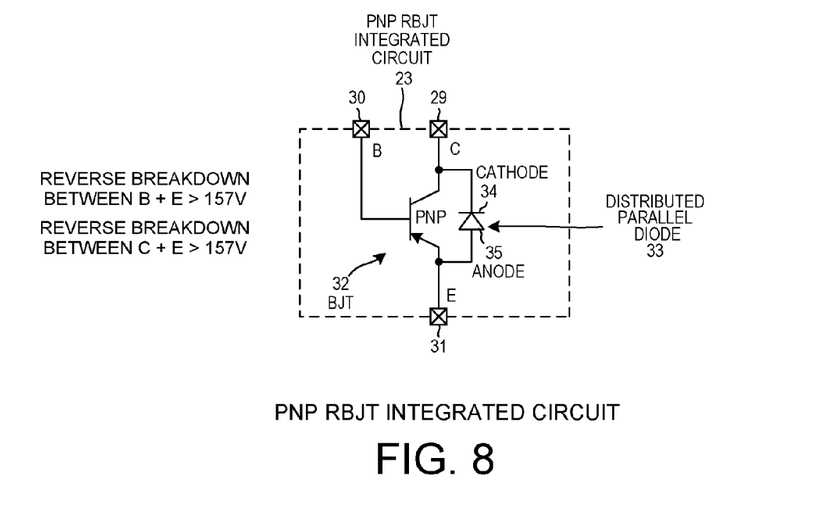
FIG. 8 is a simplified circuit diagram of one of the PNP-type RBJT integrated circuits of FIG. 7.

FIG. 8 is a schematic circuit diagram of the PNP RBJT integrated circuit 23 of FIG. 7. The RBJT integrated circuit 23 has a first terminal 29, a second terminal 30 and a third terminal 31. The RBJT integrated circuit includes a PNP bipolar transistor 32 and parallel-connected distributed diode 33. The cathode 34 of the diode is coupled to the collector of the bipolar transistor and to terminal 29. The anode 35 of the diode is coupled to the emitter of the bipolar transistor and to terminal 31. The base of the bipolar transistor is coupled to terminal 30.

Figure 9:
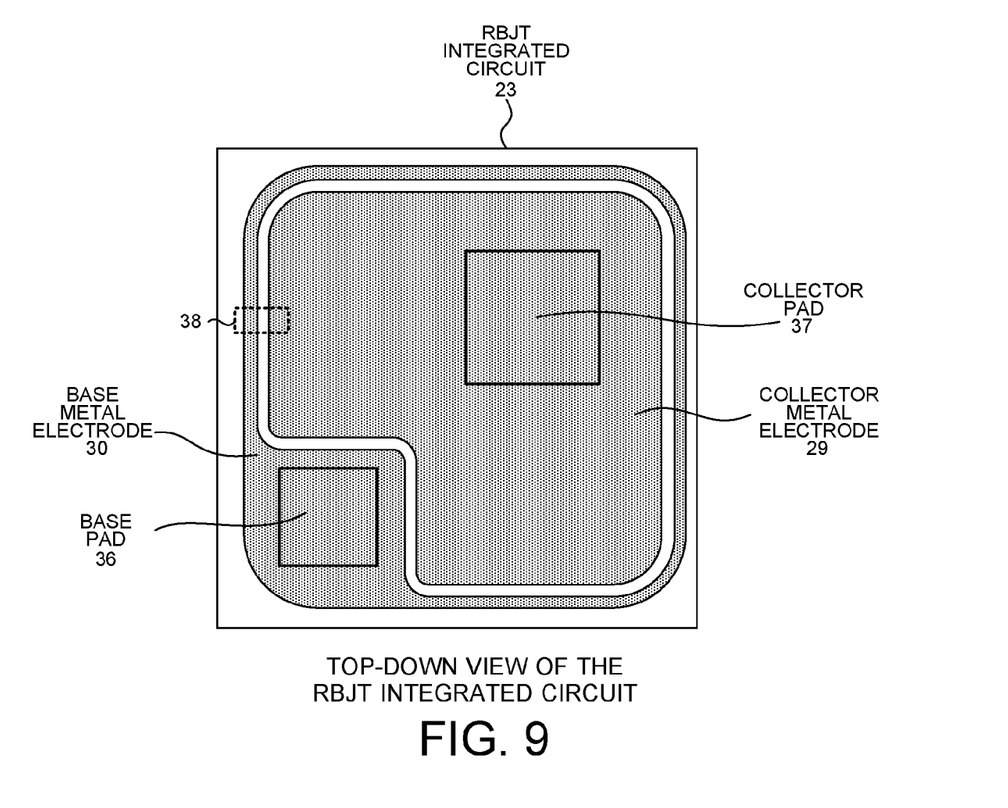
FIG. 9 is a top-down view of the RBJT integrated circuit of FIG. 8.

FIG. 9 is a top-down diagram of the PNP RBJT integrated circuit 23 of FIG. 8. The top of the integrated circuit is actually covered with passivation, with the exception of the base pad area 36 and the collector pad area 37. The base pad area 36 is actually part of the larger base metal terminal and electrode 30. Similarly, the collector pad area 37 is actually a part of the larger collector metal terminal and electrode 29. The emitter metal terminal and electrode 31 (not shown) is disposed on the bottom side of the die.

Figure 10:
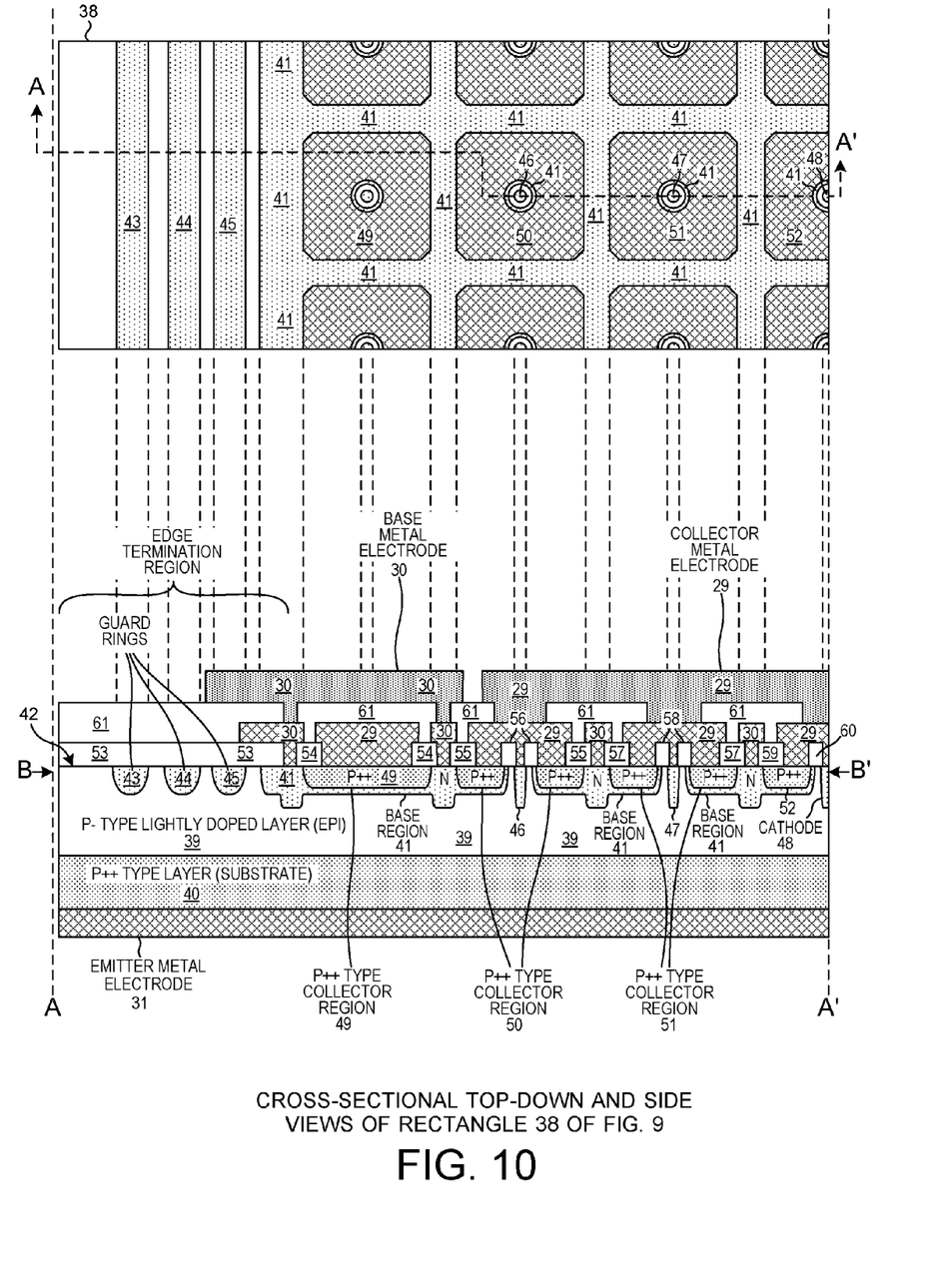
FIG. 10 is a diagram that includes at the bottom a cross-sectional side view of a rectangle portion of the RBJT integrated circuit of FIG. 9, and also includes at the top a cross-sectional top-down view of the same rectangle portion of the RBJT integrated circuit of FIG. 9.

FIG. 10 is a diagram that includes at the bottom a cross-sectional side view of the rectangle portion 38 of the RBJT integrated circuit 29 shown in FIG. 9, and also includes at the top a cross-sectional top-down view of the rectangle portion 38. The cross-sectional side view at the bottom of FIG. 10 is taken along the section line A-A' in the top view of FIG. 10. The cross-sectional top-down view at the top of FIG. 10 is taken along the sectional line B-B' in the bottom view of FIG. 10.

A P− type layer 39 of epitaxial silicon is grown on a P++ type layer 40 of monocrystalline bulk silicon substrate wafer material. An N type base region 41 is formed by ion implantation and subsequent thermal diffusion so that it extends from the upper surface 42 of the epitaxial layer 39 and down into the layer 39. Parts of the base region 41, as well a plurality of guard rings 43-45 are implanted and are diffused deeper to form the deeper parts of the N type regions as shown. Moreover, a plurality of still deeper distributed diode diffusion regions (N type cathode diffusion regions) 46-48 are also formed into the layer 39. Not all the cathode diffusion regions are numbered in the diagram, but the cathode diffusion regions are disposed in a two-dimensional array across the surface of the integrated circuit as is seen in the top view of FIG. 10.

A plurality of P++ type collector regions 49-52 is formed by ion implantation and thermal diffusion so that the collector regions extend down into the base region as shown. Each of these P++ type collector regions has a somewhat rectangular annular shape when considered from the top-down perspective. Each has a circular central hole, and rings around and surrounds a corresponding one of the plurality of N type cathode diffusion regions. These deeper N type cathode diffusion regions together are the cathode 34 of the parallel-connected distributed diode 33. P− type silicon of the epitaxial layer encircles and surrounds the peripheral sides of each N type cathode region so that the N type cathode region does not adjoin and does not merge with any part of the N type base region. A layer of insulation is patterned into a plurality of insulation features 53-60, including annular insulation features 54-60. The layer of insulation in one example is a 1.0 micron thick layer of chemical vapor deposition (CVD) deposited silicon oxide. The collector metal electrode 29 makes contact with the collector regions 49-52. The collector metal electrode 29 includes patterned parts of a first metal layer and patterned parts of a second metal layer. The collector metal electrode 29 also makes contact with each of the plurality of N type cathode regions 46-48 as shown. Importantly, however, the collector metal electrode 29 does not contact any part of the N type base region 41. In addition to the collector metal electrode, the RBJT integrated circuit also includes the base metal electrode 30. This base metal electrode 30, like the collector metal electrode 29, includes patterned parts of the first metal layer and patterned part of the second metal layer. The base metal electrode 30 makes contact with the base region 41 as shown, but does not make contact with any of the collector regions or any of the cathode regions or with the collector metal electrode. Reference numeral 61 identifies a second insulation layer. The entire bottom surface of the substrate silicon layer 40 is covered with a layer of metal. This metal layer is the emitter metal electrode 31 of the integrated circuit device. The P-type layer 39 is an emitter/distributed diode electrode layer, some parts of which are the emitter of the bipolar transistor of the RBJT integrated circuit, and other parts of which are an electrode (in this case, the anode electrode) of the distributed parallel diode of the RBJT integrated circuit.

Figure 11:
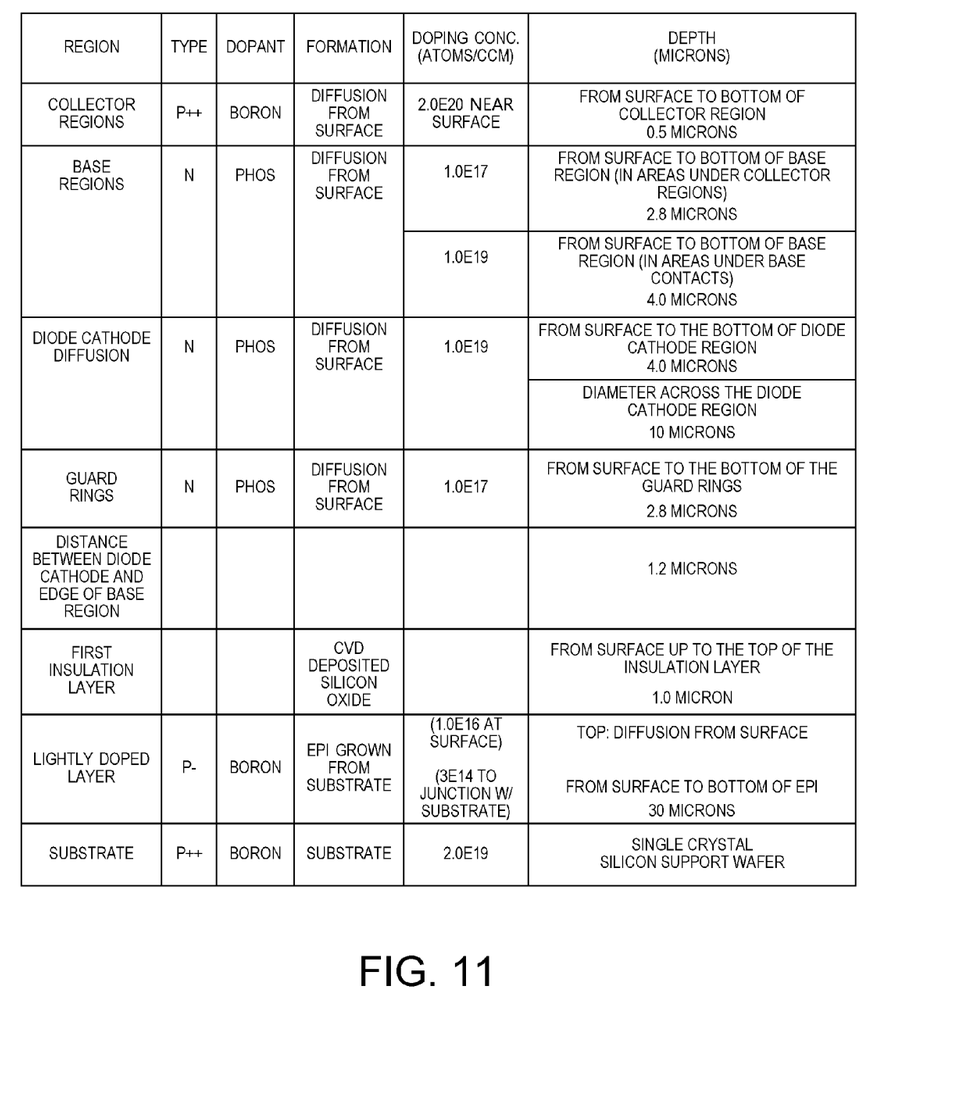
FIG. 11 is a table that sets forth doping concentrations and depths and other parameters and characteristics and dimensions of the RBJT integrated circuit of FIG. 9.

FIG. 11 is a table that sets forth doping concentrations and depths and other parameters and characteristics and dimensions of the PNP RBJT integrated circuit 23.

Figure 12:
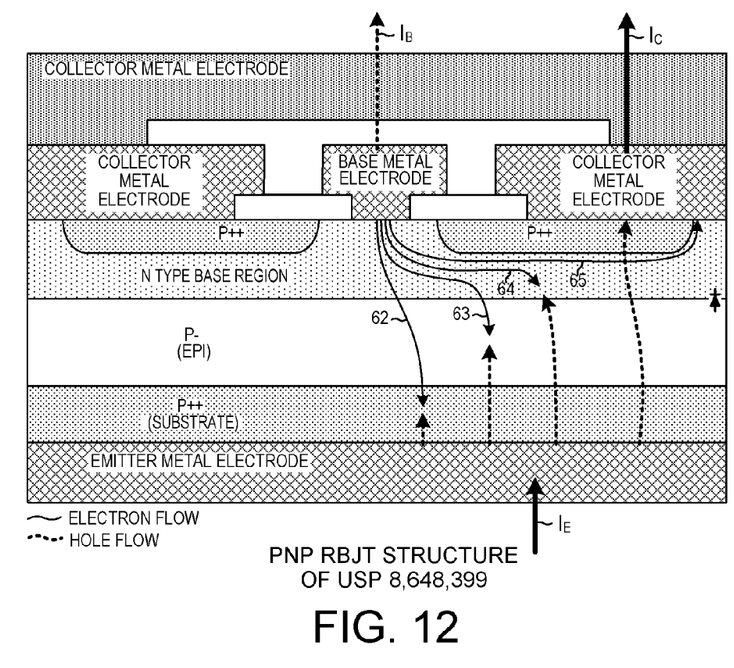
FIG. 12 is a cross-sectional diagram that illustrates a PNP-type RBJT integrated circuit structure as disclosed in U.S. Pat. No. 8,648,399.

FIG. 12 is a cross-sectional diagram that illustrates a PNP RBJT integrated circuit structure as disclosed in U.S. Pat. No. 8,648,399. U.S. Pat. No. 8,648,399 discloses and discusses an application for a low forward voltage rectifier in the secondary side of a switching flyback converter. In the flyback converter application, the low forward voltage rectifier is called on to turn on and off at a relatively high switching frequency of the main switch of the flyback converter. This switching frequency may, for example, be 30 kHz or more. Consequently, the RBJT integrated circuit should turn on and conduct current, and then turn off relatively quickly when one of the current pulses has ended. When the RBJT integrated circuit device is fully on and the bipolar transistor portion of the device is on and saturated, the base current $I_B$ can be considered as having four components: 1) a current due to electrons reaching the P++ substrate and recombining there with holes as indicated by arrow 62; 2) a current due to electrons reaching the P– epitaxial layer and recombining there with holes as indicated by arrow 63; 3) a current due to electrons passing through the base region and recombining there with holes as indicated by arrow 64; and 4) a current due to electrons passing through the base region and reaching the collector electrode and recombining with holes there as indicated by arrow 65. The device of FIG. 12 exhibits a faster turn off than the device of FIG. 13, and it is believed that a reason for this is that the fourth current indicated by arrow 65 reduces the concentration of charge carriers in the P– epitaxial layer and thereby promotes faster turn off of the device. This faster turn off is generally desirable in a high-frequency switching application because the rectifier RBJT is called up to turn on and turn off many times a second, and a slow turn off would result in a substantial amount of aggregate time when the device is still conducting some current but is not fully on. In a low frequency 60 Hz switching application, however, it has been found that providing the current path from the base electrode and under the collector region and to the collector metal electrode as indicated by arrow 65 is undesirable. It has been found that during the steady state on condition of the RBJT integrated circuit, when the bipolar transistor is to be fully on and saturated, there is a constant steady state leakage of base current out of the collector metal electrode. Due to this leakage of base current, a larger amount of overall base current (from the perspective of outside the RBJT integrated circuit) is required in order to achieve a given emitter current flow through the device. For the bipolar transistor to operate in saturation under normal $I_C$ current levels, the base current must be about one quarter of the collector current. If some of the base current flowing through the base metal electrode does not contribute to this one quarter requirement, but rather is wasted due to leakage to the collector metal electrode, then even more base current is required (from the perspective of outside the RBJT integrated circuit) in order to supply the necessary one quarter of $I_C$ base current for bipolar transistor saturation. Accordingly, the leakage of base current present in the structure of FIG. 12 reduces efficiency of the RBJT integrated circuit device in the low frequency 60 Hz rectifier application.

Figure 13:
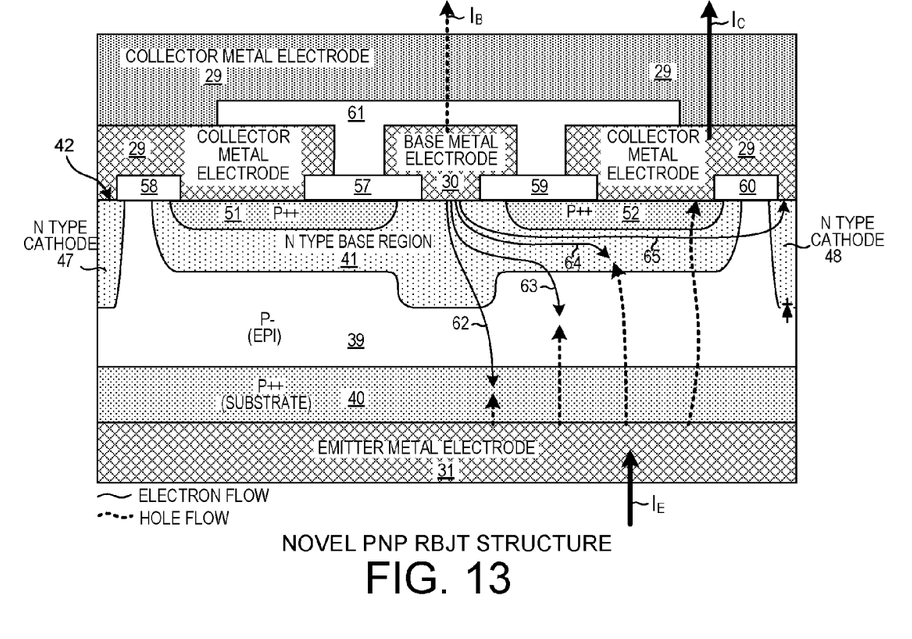
FIG. 13 is a cross-sectional diagram that illustrates an operation of the novel PNP RBJT integrated circuit 23.

FIG. 13 is a cross-sectional diagram that illustrates an operation of the novel PNP RBJT integrated circuit 23. The steady state on base current can be thought of as having the same four components as illustrated in FIG. 12, except that in the novel structure of FIG. 13 the fourth component of current flow 65 passes laterally out of the base region 52, through an amount of P– type silicon, and into the N type cathode region 48, and only then passes upward to the collector metal electrode 29. The two PN junctions across which this current must flow is thought to reduce the magnitude of the fourth current component substantially as compared to the magnitude of the fourth current component in the structure of FIG. 12. The intervening patterned feature 60 of insulation blocks current flow from passing upward from the N type base region 41 directly into the collector metal electrode 29, and also blocks current flow from passing upward from the P– type epitaxial silicon (P– silicon between the base region 41 and the cathode region 48) directly into the collector metal electrode 29. This insulation feature 60 has a ring-shape or washer-shape when considered from the top-down perspective. It covers the circular boundary surface where the N type base region 41 reaches the upper semiconductor surface 42, and it also covers the circular boundary surface where P– type silicon of the emitter/anode layer 39 reaches the upper semiconductor surface 42. From the top-down perspective, these two boundary surfaces appear as concentric rings, and the ring-shaped insulation feature 60 covers them both. From the top-down perspective, the ring-shaped insulation feature 60 extends around and covers the outer circular periphery of the top of the cathode region 48 where the N type material of the cathode region 48 reaches the upper semiconductor surface 42. Due to the isolation of the base region from the collector metal electrode, however, there is little or no steady state leakage of base current to the collector metal electrode as there is in the RBJT integrated circuit of FIG. 12. This serves to reduce power dissipation of the RBJT device of FIG. 13 in the low frequency application of the ACLF/RM as compared a situation where the RBJT device of FIG. 12 were employed in the low frequency application.

Figure 14:
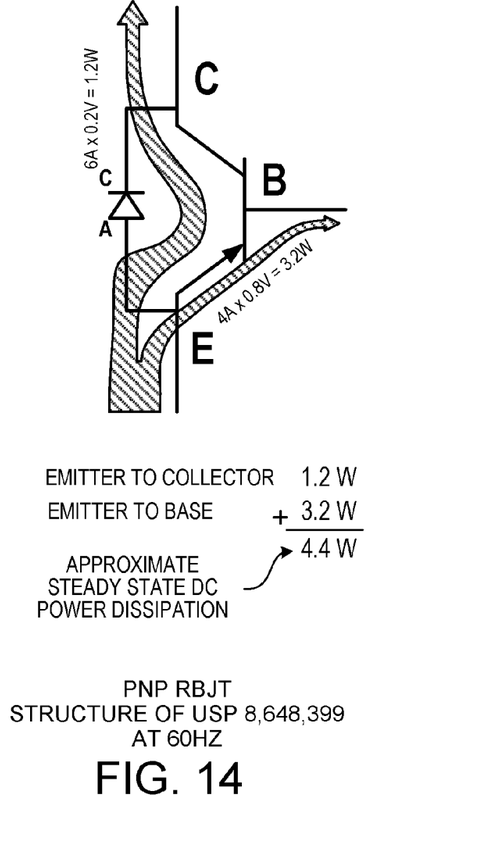
FIG. 14 illustrates current flow through the RBJT integrated circuit device of FIG. 12 in a steady-state on condition.

FIG. 14 illustrates current flow through the RBJT integrated circuit device of FIG. 12 in a steady-state on condition. For ten amperes of emitter current, approximately six amperes flows out of the base metal electrode of the device. Power dissipation due to the emitter-to-collector current is only about 1.2 watts due to the low $V_{CE}$ forward voltage drop of the device, but the power dissipation due to the current flowing out of the base metal electrode is relatively large at about 3.2 watts. The resulting combined power dissipation is about 4.4 watts.

Figure 15:
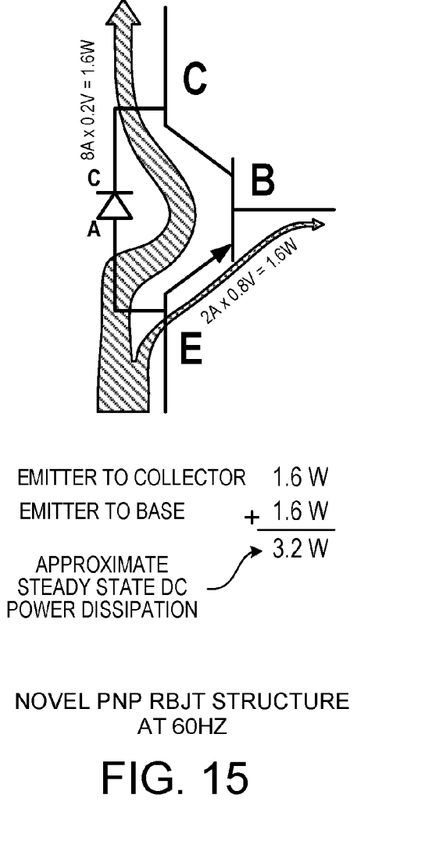
FIG. 15 illustrates current flow through the novel RBJT integrated circuit device of FIG. 13 in a steady-state on condition.

FIG. 15 illustrates the current flow through the novel RBJT integrated circuit device of FIG. 13 in a steady-state on condition. For ten amperes of emitter current, only about two amperes flows out of the base metal electrode of the device. Power dissipation due to the emitter-to-collector current is about 1.6 watts due to the low forward voltage $V_{CE}$ drop of the device, while at the same time the power dissipation due to the current flowing out of the base metal electrode is a relatively small 1.6 watts. The resulting combined power dissipation is about 3.2 watts.

Figure 16:
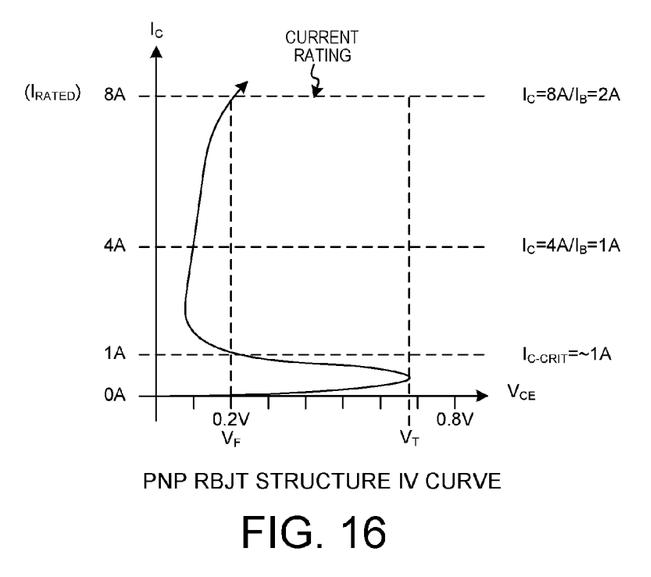
FIG. 16 is an IV (current-to-voltage) curve for the novel PNP-type RBJT integrated circuit 23 of FIG. 9.

FIG. 16 is an IV (current-to-voltage) curve for the novel PNP RBJT integrated circuit 23 of FIG. 13. If the RBJT integrated circuit 23 has a collector current of at least $I_{C\text{-}CRIT}$ in the application circuit of FIG. 7, and if the collector current is not greater than the $I_{RATED}$ value of eight amperes, then the $V_{CE}$ forward voltage drop across the RBJT integrated circuit 23 will be not more than the rated 0.2 volts.

Figure 17:
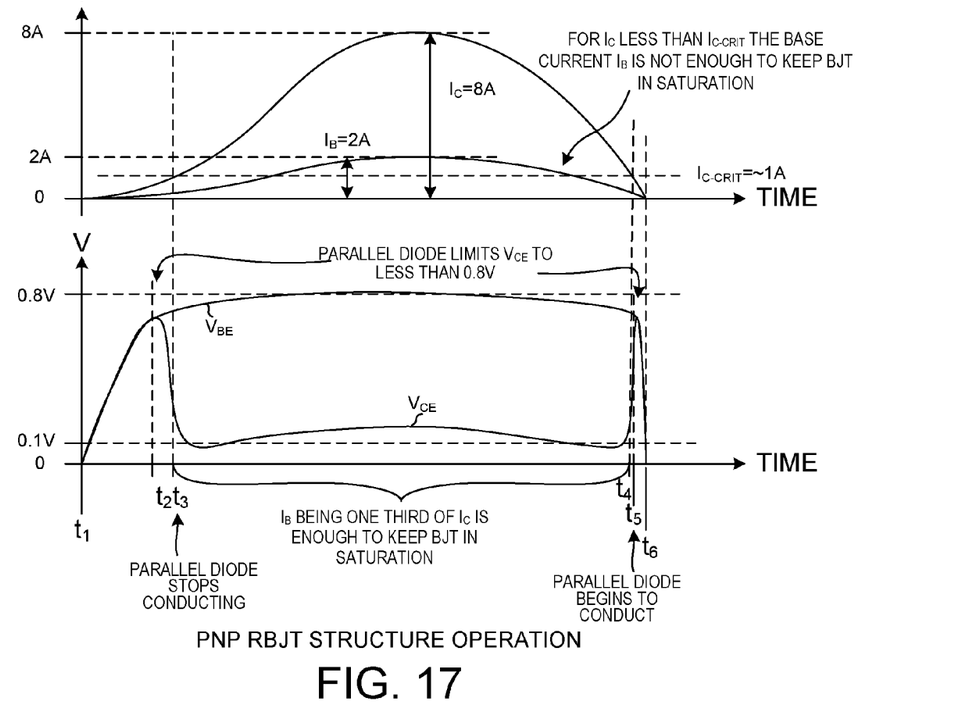
FIG. 17 is a waveform diagram that illustrates how the novel PNP-type RBJT integrated circuit 23 of FIG. 9 turns on and then off during a first half cycle of a sinusoidal 110 VAC 60 Hz supply voltage.

FIG. 17 is a waveform diagram that illustrates how the novel PNP RBJT integrated circuit 23 turns on and then off during a first half cycle of a 110 VAC 60 Hz supply voltage. Initially, as the current flowing into the ACLF/RM increases from zero current at the moment when the absolute value of input voltage becomes higher than the output capacitor voltage, the forward voltage $V_{CE}$ across the RBJT integrated circuit increases. The bipolar transistor is initially off and is not conducting current. When the forward voltage $V_{CE}$ across the RBJT integrated circuit exceeds the threshold voltage $V_T$ of the parallel diode, which is about 0.65 volts, then the parallel diode begins to conduct a small amount of current. As the collector current $I_C$ through the RBJT integrated circuit increases further, the $V_{CE}$ voltage drop across the device is limited by the diode. As the current $I_C$ through the RBJT integrated circuit continues to increase, the base current flowing through the bipolar transistor also increases, and the bipolar transistor begins to turned on at time t2. As the bipolar transistor turns on, the $V_{CE}$ across the RBJT integrated circuit begins to decrease. As the current though the base of the bipolar transistor increases still further, the bipolar transistor becomes saturated at time t3. This occurs when the current $I_C$ reaches the critical current $I_{C\text{-}CRIT}$. At this point, the forward voltage drop $V_{CE}$ across the device has dropped to about 0.1 volts. The bipolar transistor is operating in its saturation mode. As the voltage of the 110 VAC supply voltage continues to increase, this condition persists and the RBJT integrated circuit continues to operate in the steady-state on condition with the bipolar transistor being in saturation. The AC voltage peak of the 110 VAC supply voltage is reached and the voltage of the 110 VAC then begins to decrease. As the AC voltage decreases, so too does the current $I_C$ flowing through the device. When the current flow drops below $I_{C\text{-}CRIT}$, then there is not enough base current flowing through the bipolar device to keep it saturated. The bipolar transistor of the RBJT device therefore comes out of saturation, and the forward voltage drop VCE across the device begins to rise at time t4. When the $V_{CE}$ forward voltage drop across the device is high enough to exceed the 0.65 volt threshold voltage of the diode, the diode begins conducting current and prevents the $V_{CE}$ voltage from increasing further. As the 110 VAC supply voltage decreases still further, all current flow through the device stops and the RBJT integrated circuit is off. During the next half cycle of the 110 VAC supply voltage, this PNP RBJT integrated circuit 23 and the NPN RBJT integrated circuit 20 are off, and the other PNP RBJT integrated circuit 21 and the other NPN RBJT integrated circuit 22 of the full-wave bridge rectifier conduct. Then in the next half cycle of the 110 VAC supply voltage, the cycle repeats.

Figure 18:
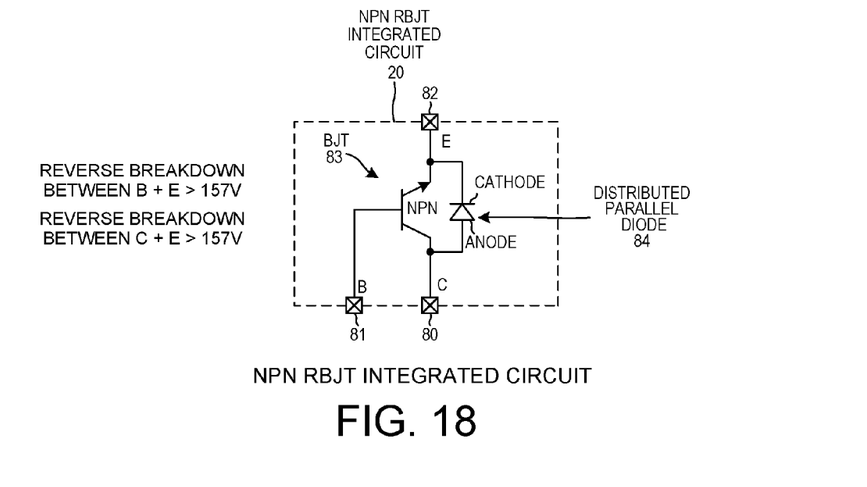
FIG. 18 is a simplified circuit diagram of one of the NPN-type RBJT integrated circuits of FIG. 7.

FIG. 18 is a schematic circuit diagram of the NPN RBJT integrated circuit 20 in accordance with another novel aspect. The RBJT integrated circuit 20 has a first terminal 80, a second terminal 81 and a third terminal 82. The RBBJT integrated circuit 20 includes an NPN bipolar transistor 83 and a parallel-connected distributed diode 84.

Figure 19:
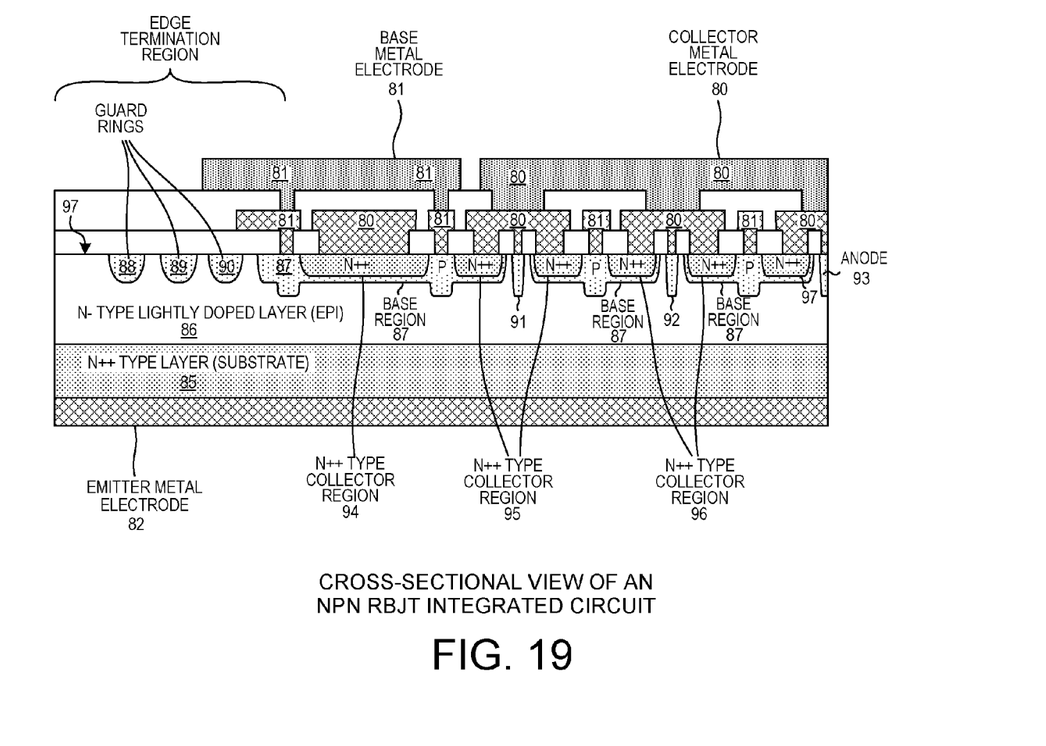
FIG. 19 is a cross-sectional diagram of a part of the NPN-type RBJT integrated circuit of FIG. 18.

FIG. 19 is a simplified cross-sectional diagram of the NPN RBJT integrated circuit 20 of FIG. 18. The NPN RBJT integrated circuit 20 of FIG. 19 has a nearly identical structure to the structure of the PNP RBJT integrated circuit of FIG. 10, except that the doping types of the various semiconductor regions are reversed. For example, the substrate silicon layer 85 is N++ type, and the epitaxial layer 86 is N- type. The base region 87, the guard rings 88-90, and the anode diffusion regions 91-93 are P type. Annular N++ type collector regions 94-97 are formed into the base region 87. All these regions are implanted through the upper semiconductor surface 97, so that they extend down from the semiconductor surface 97 and into epitaxial silicon. The first metal electrode 80 contacts both the annular collector regions of the bipolar transistor as well as the anode regions of the distributed diode. The N- type epitaxial layer 86 is an emitter/distributed diode electrode layer, a part of which is the emitter of the bipolar transistor 83, and another part of which is the cathode of the distributed parallel diode 84.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:
1. An integrated circuit comprising:
a first metal electrode;
a second metal electrode;
a third metal electrode;
a bipolar transistor, wherein a base of the bipolar transistor is coupled to the second metal electrode, wherein the base is separated from the first metal electrode by a plurality of insulation features, wherein the bipolar transistor has an emitter-to-base reverse breakdown voltage of at least 156 volts, and wherein the bipolar transistor has an emitter-to-collector reverse breakdown voltage of at least 156 volts; and
a distributed parallel diode, wherein a first electrode of the distributed parallel diode is coupled to a collector of the bipolar transistor and is also coupled to the first metal electrode, wherein a second electrode of the distributed parallel diode is coupled through substrate material to an emitter of the bipolar transistor and is also coupled to the third metal electrode, wherein the collector of the bipolar transistor extends into and is surrounded by the base, and wherein the first electrode of the distributed parallel diode is separated from the base by the insulation features.

2. The integrated circuit of claim 1, wherein the bipolar transistor is a PNP transistor, and wherein the first electrode of the distributed parallel diode is a plurality of cathode diffusion regions.

3. The integrated circuit of claim 1, wherein the bipolar transistor is an NPN transistor, and wherein the first electrode of the distributed parallel diode is a plurality of anode diffusion regions.

4. The integrated circuit of claim 1, wherein the base is in contact with the insulation features, and wherein the first metal electrode is in contact with the insulation features.

5. The integrated circuit of claim 1, wherein the base is electrically insulated from the first metal electrode by the insulation features.

6. The integrated circuit of claim 1, wherein the insulation layer forms a plurality of washer-shaped annular features of insulation.

7. The integrated circuit of claim 6, wherein the first metal electrode is separated from the base by the plurality of washer-shaped annular features of insulation.

8. The integrated circuit of claim 1, wherein the collector of the bipolar transistor extends into the base by 0.5 microns.

9. The integrated circuit of claim 1, wherein the base of the bipolar transistor extends under the collector of the bipolar transistor from an upper semiconductor surface 2.8 microns into the emitter of the bipolar transistor.

10. The integrated circuit of claim 1, wherein the collector of the bipolar transistor has a rectangular annular shape when considered from a top-down perspective.

11. The integrated circuit of claim 1, wherein the first electrode of the distributed parallel diode extends from an upper semiconductor surface four microns into the emitter of the bipolar transistor.

12. The integrated circuit of claim 1, wherein the first electrode of the distributed parallel diode extends from an upper semiconductor surface down into the emitter of the bipolar transistor a greater distance than the base of the bipolar transistor extends under the collector of the bipolar transistor down from the upper semiconductor surface into the emitter of the bipolar transistor.

13. An integrated circuit comprising:
a first metal electrode;
a second metal electrode;
a third metal electrode;
a bipolar transistor, wherein a collector of the bipolar transistor is coupled to the first metal electrode, wherein a base of the bipolar transistor is coupled to the second metal electrode, wherein an emitter of the bipolar transistor is coupled to the third metal electrode, wherein the bipolar transistor has an emitter-to-base reverse breakdown voltage of at least 156 volts, and wherein the bipolar transistor has an emitter-to-collector reverse breakdown voltage of at least 156 volts;
means for insulating the first metal electrode from the base and from the emitter of the bipolar transistor; and
a distributed parallel diode, wherein a first electrode of the distributed parallel diode is coupled to the first metal electrode, wherein a second electrode of the distributed parallel diode is coupled via wafer material to the third metal electrode, wherein the collector of the bipolar transistor extends into and is surrounded by the base, and wherein the first electrode of the distributed parallel diode is separated from the base by the means.

14. The integrated circuit of claim 13, wherein the integrated circuit comprises a silicon layer, and wherein the means for insulating is disposed on a surface of the silicon layer.

15. The integrated circuit of claim 14, wherein the means for insulating comprises a plurality of washer-shaped annular features of insulation.

16. The integrated circuit of claim 13, wherein the means for insulating is at least one micron thick.

17. The integrated circuit of claim 13, wherein the collector of the bipolar transistor extends 0.5 microns into the base of the bipolar transistor.

18. The integrated circuit of claim 13, wherein the base of the bipolar transistor extends under the collector of the bipolar transistor from an upper semiconductor surface 2.8 microns into the emitter of the bipolar transistor.

19. The integrated circuit of claim 13, wherein the first electrode of the distributed parallel diode extends from an upper semiconductor surface down into the emitter of the bipolar transistor a greater distance than the base of the bipolar transistor extends under the collector of the bipolar transistor down from the upper semiconductor surface into the emitter of the bipolar transistor.

20. An integrated circuit comprising:
a first metal electrode;
a second metal electrode;
a third metal electrode;
a bipolar transistor, wherein a base of the bipolar transistor is coupled to the second metal electrode, wherein the bipolar transistor has an emitter-to-base reverse breakdown voltage of at least 156 volts, and wherein the bipolar transistor has an emitter-to-collector reverse breakdown voltage of at least 156 volts; and
a distributed parallel diode, wherein a first electrode of the distributed parallel diode is coupled to a collector of the bipolar transistor and is also coupled to the first metal electrode, wherein a second electrode of the distributed parallel diode is coupled via substrate wafer material to an emitter of the bipolar transistor and is also coupled to the third metal electrode, and wherein the collector of the bipolar transistor extends into and is surrounded by the base, and the first metal electrode is electrically isolated from the base.

\* \* \* \* \*